US009225134B2

(12) United States Patent
Lin et al.

(10) Patent No.: US 9,225,134 B2
(45) Date of Patent: Dec. 29, 2015

(54) PENETRATION AND ASSEMBLY STRUCTURE FOR FLEXIBLE CIRCUIT BOARD WITH HINGE ASSEMBLY

(71) Applicant: ADVANCED FLEXIBLE CIRCUITS CO., LTD., Taoyuan County (TW)

(72) Inventors: Gwun-Jin Lin, Taoyuan County (TW); Chih-Heng Chuo, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 14/138,364

(22) Filed: Dec. 23, 2013

(65) Prior Publication Data

US 2015/0029685 A1    Jan. 29, 2015

(30) Foreign Application Priority Data

Jul. 26, 2013 (TW) .............................. 102126786 A

(51) Int. Cl.
| | |
|---|---|
| *H01R 35/02* | (2006.01) |
| *H01R 12/61* | (2011.01) |
| *H05K 1/02* | (2006.01) |
| *H05K 1/11* | (2006.01) |
| *H05K 5/02* | (2006.01) |

(52) U.S. Cl.
CPC ............... *H01R 35/02* (2013.01); *H05K 1/028* (2013.01); *H05K 1/118* (2013.01); *H05K 5/0226* (2013.01); *H05K 2201/055* (2013.01); *H05K 2201/2009* (2013.01)

(58) Field of Classification Search
CPC ................................ H01R 35/02; H05K 1/028
USPC ........................................... 361/749; 174/254
See application file for complete search history.

(56) References Cited

U.S. PATENT DOCUMENTS

| | | | | |
|---|---|---|---|---|
| 7,448,891 | B2 * | 11/2008 | Ahn .............................. | 439/165 |
| 2011/0067903 | A1 * | 3/2011 | Lin et al. ........................ | 174/254 |
| 2012/0092837 | A1 * | 4/2012 | Tanaka et al. .................. | 361/749 |

* cited by examiner

*Primary Examiner* — Tuan T Dinh
*Assistant Examiner* — Rockshana Chowdhury
(74) *Attorney, Agent, or Firm* — Morton J. Rosenberg

(57) ABSTRACT

Disclosed is a penetration and assembly structure for a flexible circuit board with a hinge assembly. With a pre-folding line formed on a pre-prepared flexible circuit board serving as a center line, a connection section of the flexible circuit board is folded to a terminal distribution section, and then, the connection section and an extended sheet are wound up in a direction towards the terminal distribution section to form the connection section into a rolled body with the extended sheet wrapped around the rolled body to provide an effect of protection. The rolled body is then inserted through a bore of a hinge assembly so that after the rolled body completely passes through the bore of the hinge assembly, the extension section of the flexible circuit board is located in the bore of the hinge assembly and the first end and the second end are respectively set at opposite ends of the bore of the hinge assembly. In other applications, a reinforcement plate is included to reinforce the terminal distribution section of the flexible circuit board.

5 Claims, 15 Drawing Sheets

PENETRATION AND ASSEMBLY STRUCTURE FOR FLEXIBLE CIRCUIT BOARD WITH HINGE ASSEMBLY

BACKGROUND OF THE INVENTION

1. Field of the Invention

The present invention relates to a penetration and assembly structure for a flexible circuit board with a hinge assembly, and in particular to a structure for realizing penetration of a flexible circuit board through a hinge assembly.

2. The Related Arts

A lot of electronic devices or communication devices that are currently available in the market include and use hinge structures. For example, in the structure designs of the currently prevailing mobile phones, a cover or a screen is often coupled to a phone body with a hinge structure. To allow electronic signals to be transmitted to the cover or screen, a circuit board or electronic component that penetrate through the hinge structure must be made flexible.

Thus, in a product of such a hinge structure, to have a flexible circuit board that is made of a flexible material penetrating through and combined with a bore of the hinge structure, since the flexible circuit board is often of a width greater than the bore size and insertion sections that are formed at opposite ends of the flexible circuit board are made with an even greater size, it becomes a challenge, as well as an important technical issue of the industry, to put the flexible circuit board through the hinge bore.

Heretofore, the flexible circuit board is wound as a rolled object and a specifically provided protection tube is provided to wrap around the rolled object before an insertion operation proceeds. The protection tube provides an effect of protection in a assembly operation.

However, in such an arrangement, after the assembly operation, it is also troublesome if an attempt is made to detach the hinge structure. Further, it is also a concern about how to dispose the specifically provided protection tube after the assembly operation of the flexible circuit board. The assembly process would become tediously extended and short of efficiency if re-use is attempted for a different flexible circuit board. On the other hand, waste of expense will result if simple disposal is adopted.

All these concerns indicate the conventional way is imperfect and further improvement is desired in the penetration and assembly of a flexible circuit board.

SUMMARY OF THE INVENTION

In view of the above-discussed shortcomings associated with penetration of a flexible circuit board through a bore of a hinge assembly, the primary object of the present invention is to provide a flexible circuit board, wherein the extended sheet is similarly made of a flexible material. In an operation of penetration through and assembly with the bore of the hinge assembly, the extended sheet is set to wrap around the rolled object to provide protection so that no additional arrangement, such as a protection tube, is desired.

The technical solution that the present invention adopts to address the technical issues is that with a pre-folding line formed on a pre-prepared flexible circuit board serving as a center line, a connection section of the flexible circuit board is folded to a terminal distribution section, and then, the connection section and an extended sheet are wound up in a direction towards the terminal distribution section to form the connection section into a rolled body with the extended sheet wrapped around the rolled body to provide an effect of protection. The rolled body is then inserted through a bore of a hinge assembly so that after the rolled body completely passes through the bore of the hinge assembly, the extension section of the flexible circuit board is located in the bore of the hinge assembly and the first end and the second end are respectively set at opposite ends of the bore of the hinge assembly.

With the structural design and the method of the present invention, in assembling a planar flexible circuit board to a bore of a hinge assembly, the extended sheet helps protect the flexible circuit board so that there is no need of additional protection means. Further, since the extended sheet is attached to the flexible circuit board, after the assembly, it can be reused without affecting the disposition of the flexible circuit board in an electronic device including the hinge assembly.

In disassembling electronic components, the extended sheet can serve as a grip for pulling. This is convenient and does not readily damage the flexible circuit board so as to extend the service life of the flexible circuit board.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
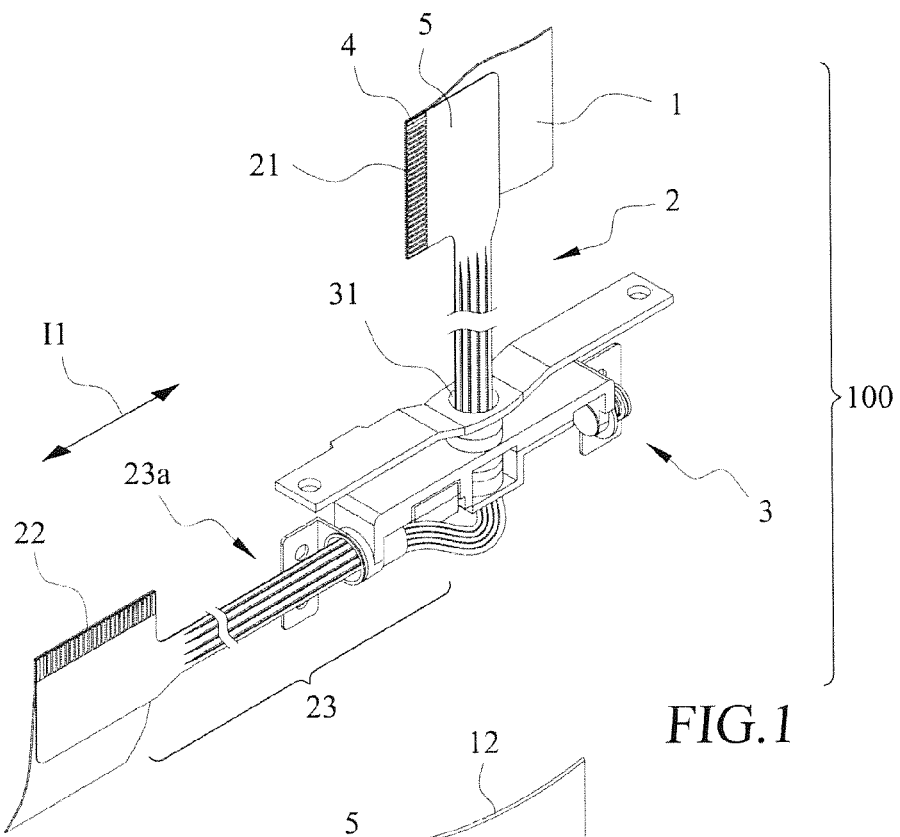
FIG. 1 is a perspective view showing a penetration and assembly structure for a flexible circuit board and a hinge assembly according to a first embodiment of the present invention.
Figure 2:
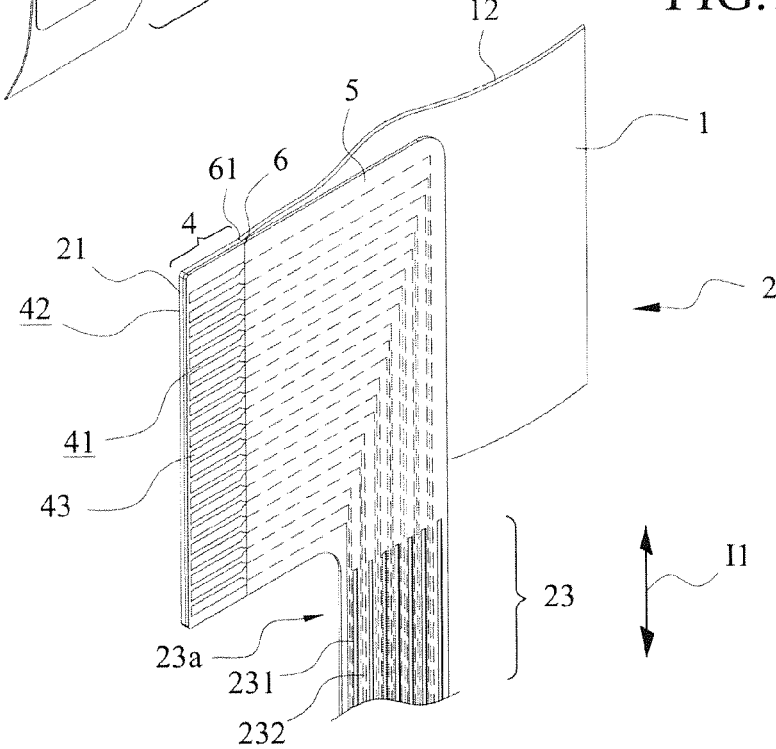
FIG. 2 is a schematic view showing the penetration and assembly structure for a flexible circuit board and a hinge assembly according to the first embodiment of the present invention.

With reference to the drawings and in particular to FIGS. 1 and 2, the present invention provides a penetration and assembly structure for a flexible circuit board and with a hinge assembly, which is generally designated at 100 and is applied to having a flexible circuit board 2 that includes an extended sheet 1 penetrating through and combined with a bore 31 of a hinge assembly 3. The flexible circuit board 2 comprises a first end 21, a second end 22, and an extension section 23 extending in an extension direction I and arranged between the first end 21 and the second end 22. The first end 21 of the flexible circuit board 2 forms a terminal distribution section 4 and a connection section 5. The flexible circuit board 2 is made of a flexible material so as to make the flexible circuit board 2 flexible and bendable.

The extension section 23 comprises a cluster structure 23a. The cluster structure 23a comprises a plurality of cluster lines 232 that is formed by cutting the flexible circuit board 2 along a plurality of slit lines 231 in the extension direction I1.

The terminal distribution section 4 of the flexible circuit board 2 comprises a first surface 41 and a second surface 42. The connection section 5 is connected between the terminal distribution section 4 and the extension section 23. The first surface 41 of the terminal distribution section 4 comprises a plurality of isolated conductive terminals 43. The terminal distribution section 4 and the connection section 5 formed therebetween a pre-folding line 6. A carve 61 can be formed along the pre-folding line 6 to serve as the pre-folding line.

The extended sheet 1 of the flexible circuit board 2 comprises an attaching section 11 and a wing 12. The attaching section 11 is attached to the second surface 42 of the terminal distribution section 4 and is registration with the first end 21 of the flexible circuit board 2. The wing 12 is formed by extending a predetermined length from the attaching section 11. The wing 12 is made of a flexible and bendable material. The extended sheet provides a function of protection during an assembling process and also serves as a grip for force application in disassembling electronic components, this being convenient and not damaging the flexible circuit board so as to extend the service life of the flexible circuit board.

Figure 3A:
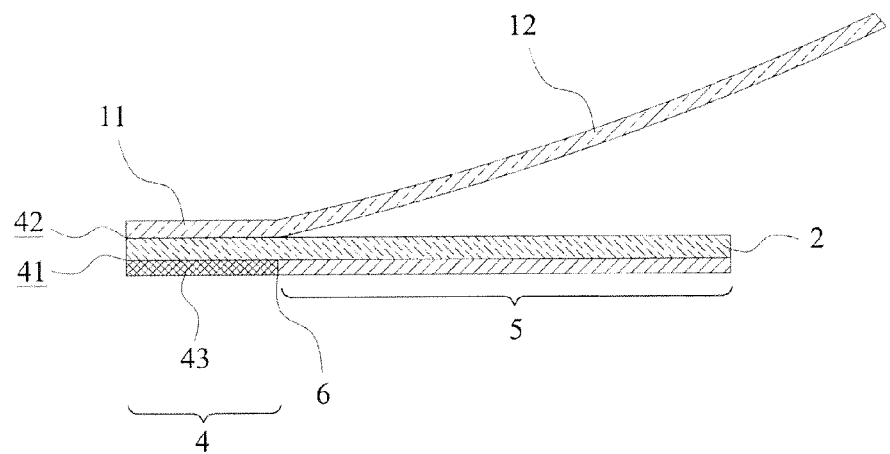
FIGS. 3A-3C illustrate successive steps of the first embodiment of the present invention.
Figure 3B:
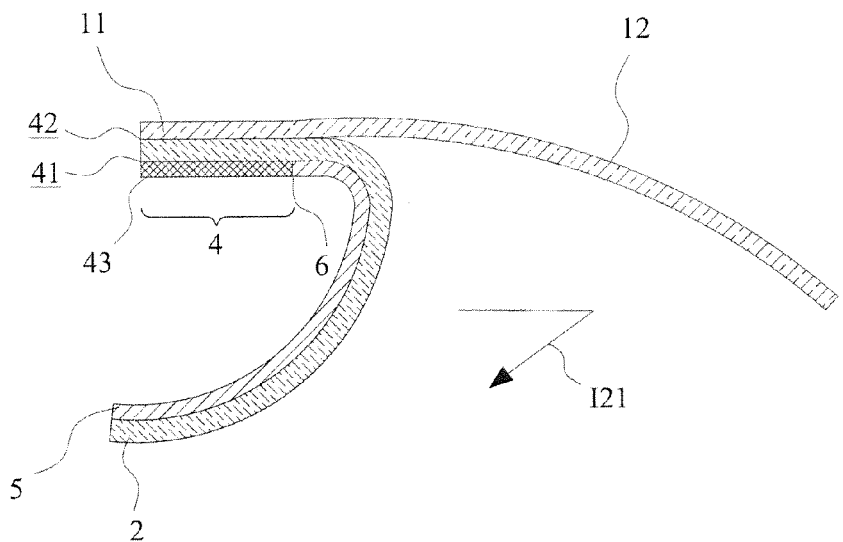
Figure 3C:
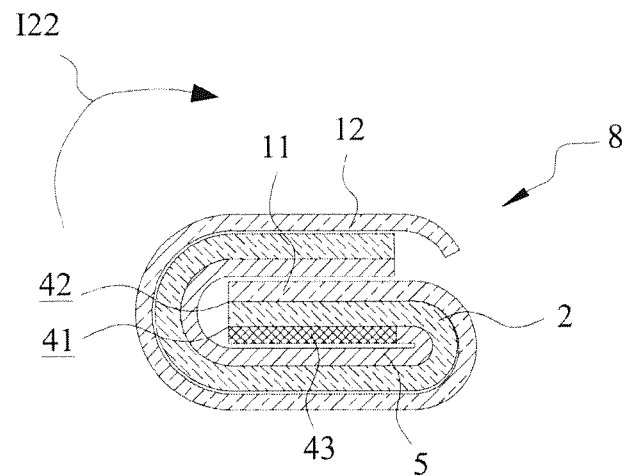

Referring to FIGS. 3A-3C, which illustrate successive steps of a process of having the flexible circuit board penetrating through and combined with a hinge assembly according to a first embodiment of the present invention, firstly, with the pre-folding line 6 formed between the terminal distribution section 4 and the connection section 5 of the first end 21 of a pre-prepared flexible circuit board 2 as a center line, the connection section 5 is folded, in a folding direction I21, toward the terminal distribution section 4 (as shown in FIG. 3B), whereby the first surface 41 of the terminal distribution section 4 is set adjacent to the connection section 5 and then, the connection section 5, together with the wing 12, is wound up in a winding direction I22 toward the terminal distribution section 4 (as shown in FIG. 3C) to form a rolled body 8.

Figure 4:
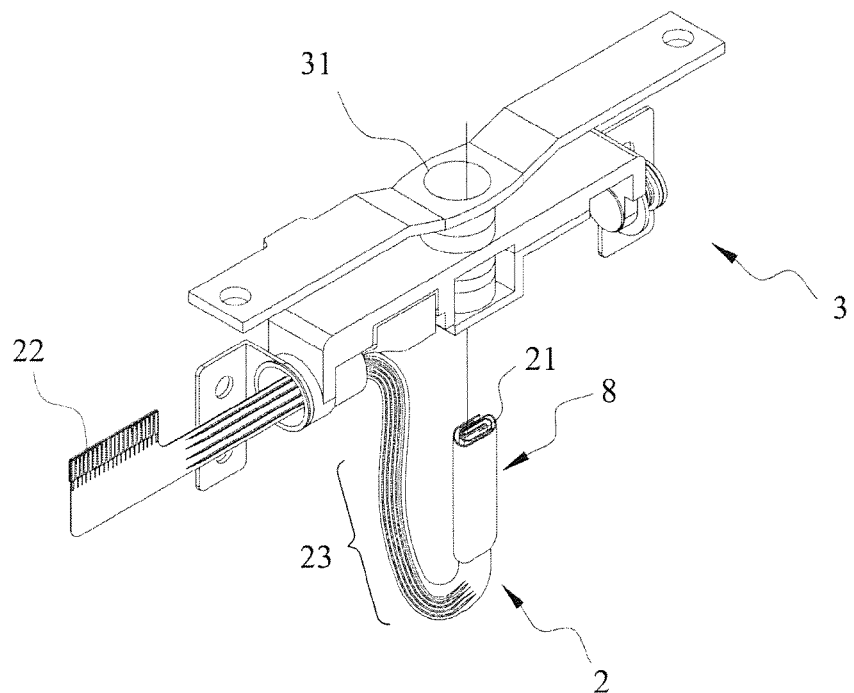
FIG. 4 is a schematic view showing the combination-completed condition of the present invention.

Next, the rolled body 8 is inserted into a bore of an hinge assembly 3 (as shown in FIG. 4), until the rolled body 8 completely passes through the bore of the hinge assembly 3 so that the extension section 23 of the flexible circuit board 2 is located in the bore of the hinge assembly 3, while the first end 21 and the second end 22 are respectively located at the opposite ends of the bore 31 of the hinge assembly 3.

During the insertion, the extended sheet 1 is kept wrapped around the flexible circuit board 2 to provide an effect of protection. Once the rolled body 8 passes through the bore 31 of the hinge assembly 3, the wing 12 of the extended sheet 1 restores the original condition and the terminal distribution section 4 resumes a flat and expanded condition (as shown in FIG. 1).

Figure 5A:
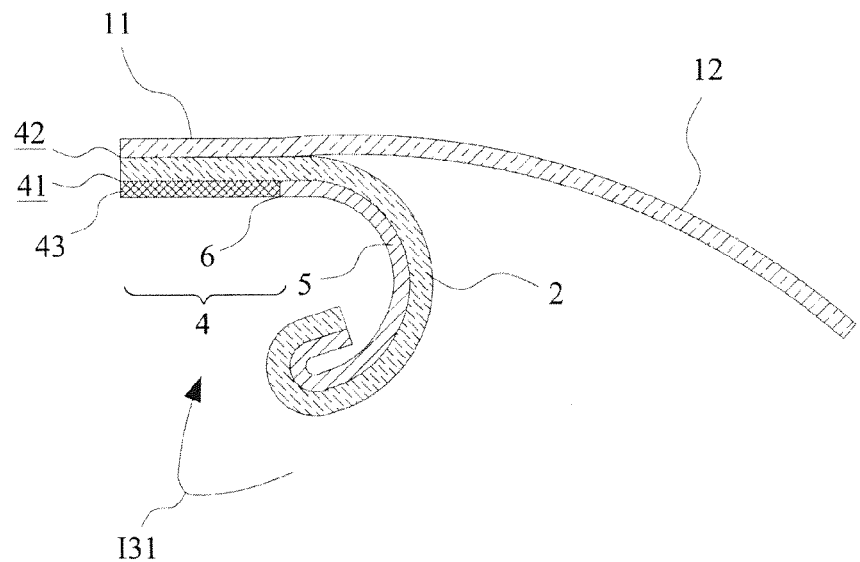
FIGS. 5A-5C illustrate successive steps of a second embodiment of the present invention.
Figure 5B:
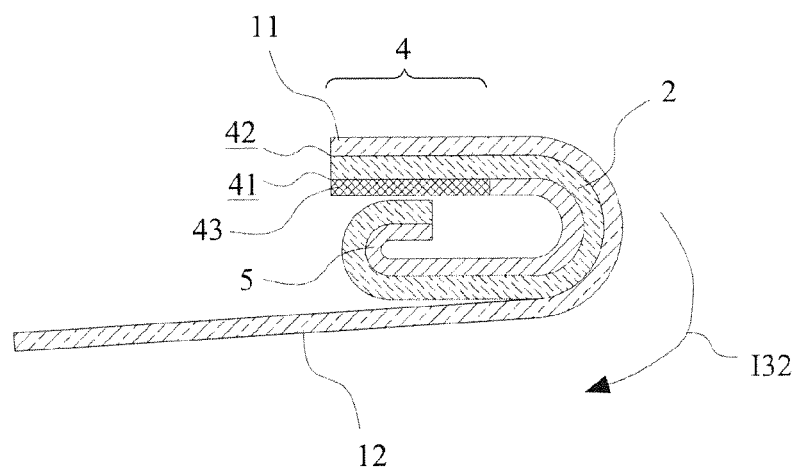
Figure 5C:
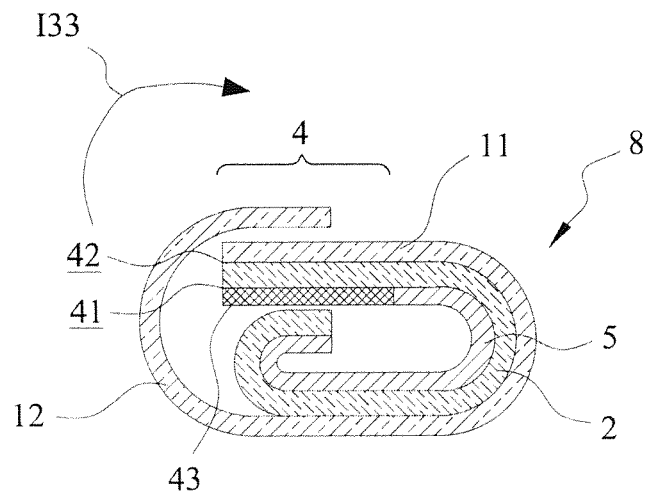

FIGS. 5A-5C illustrate successive steps of a process according to a second embodiment of the present invention. In the process, the connection section 5 is first folded in a folding direction I31 toward the first surface 41 of the terminal distribution section 4 (as shown in FIG. 5A). Next, the connection section 5, together with the wing 12 of the extended sheet 1, is wound up in a winding direction 132 (as shown in FIG. 5B). Afterwards, the wing 12 is wound, in a winding direction I33, toward the terminal distribution section 4 to form a rolled body 8 (as shown in FIG. 5C).

Similar to the previous embodiment, the rolled body 8 is inserted through the bore of the hinge assembly 3 (as shown in FIG. 4) so that the extension section 23 of the flexible circuit board 2 is located in the bore of the hinge assembly 3 while the first end 21 and the second end 22 are respectively located at opposite ends of the bore 31 of the hinge assembly 3. Finally, the wing 12 of the extended sheet 1 is expanded to allow the terminal distribution section 4 to assume a flat and expanded condition (as shown in FIG. 1).

Figure 6A:
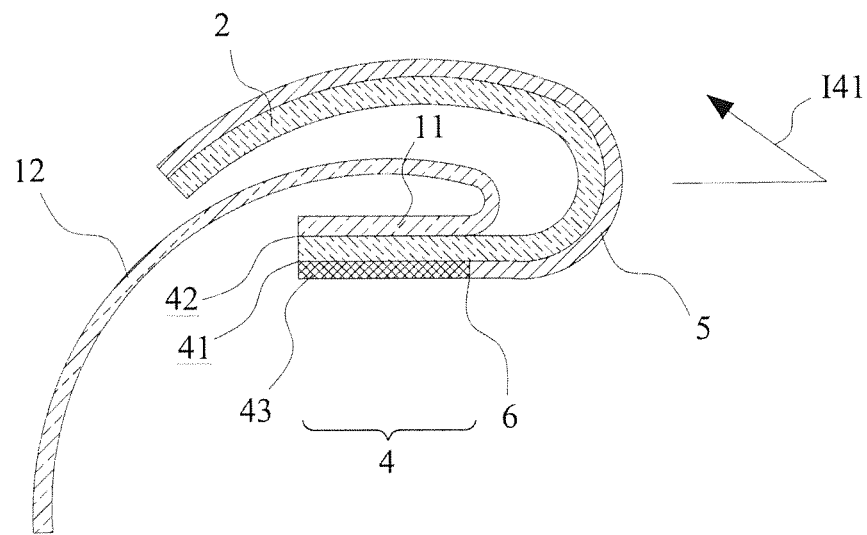
FIGS. 6A-6C illustrate successive steps of a third embodiment of the present invention.
Figure 6B:
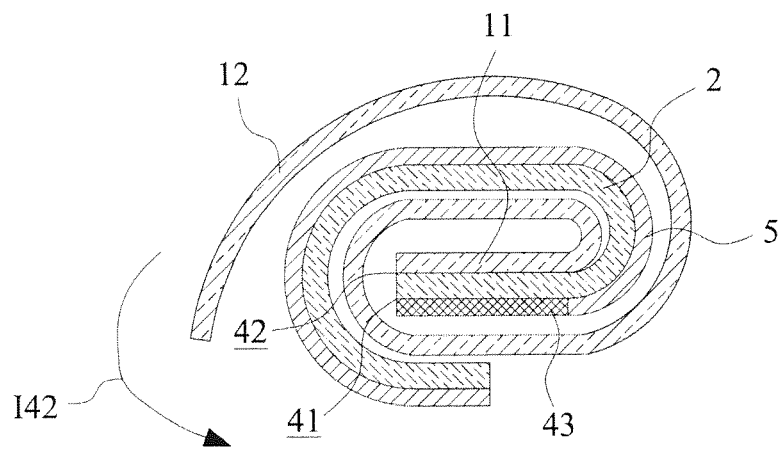
Figure 6C:
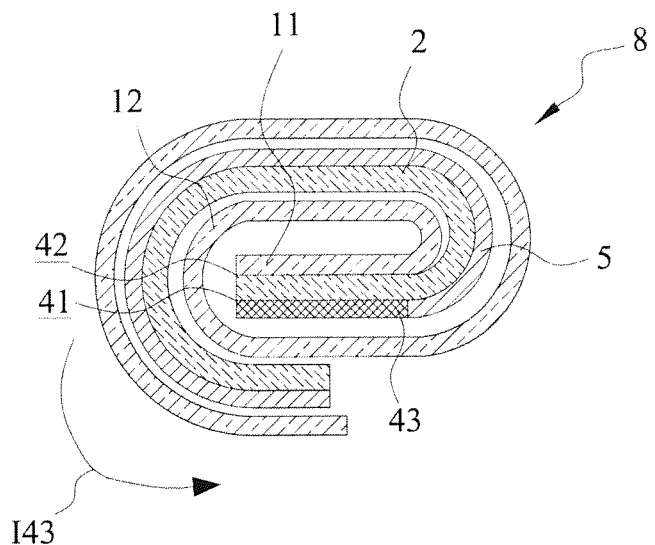

FIGS. 6A-6C illustrate successive steps of a process according to a third embodiment of the present invention. In the process, the connection section 5 is first folded in a folding direction I41 toward the second surface 42 of the terminal distribution section 4 (as shown in FIG. 6A). Next, the connection section 5, together with the wing 12 of the extended sheet 1, is wound up in a winding direction 142 (as shown in FIG. 6B). Afterwards, the wing 12 is wound, in a winding direction I43, toward the terminal distribution section 4 to form a rolled body 8 (as shown in FIG. 6C) for subsequently inserting through the bore of the hinge assembly 3 and then re-expanding the wing 12 of the extended sheet 1.

Figure 7A:
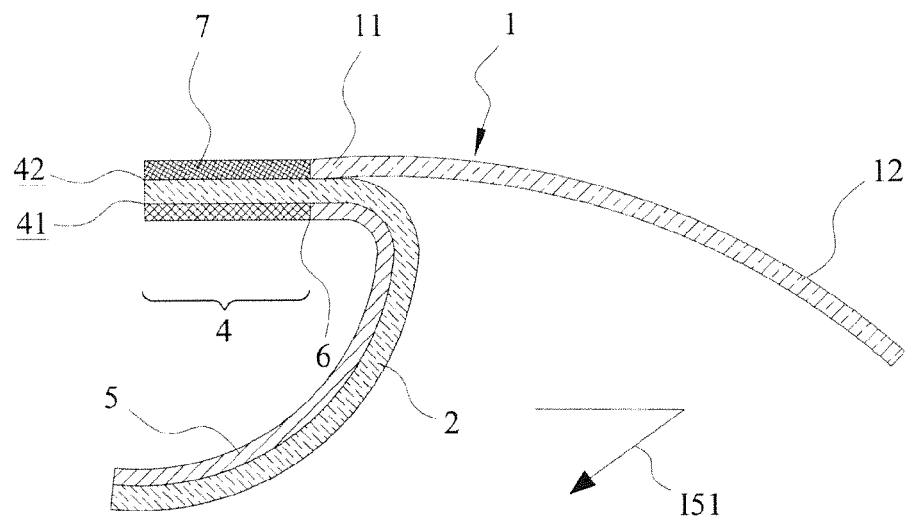
FIGS. 7A-7B illustrate successive steps of a fourth embodiment of the present invention.
Figure 7B:
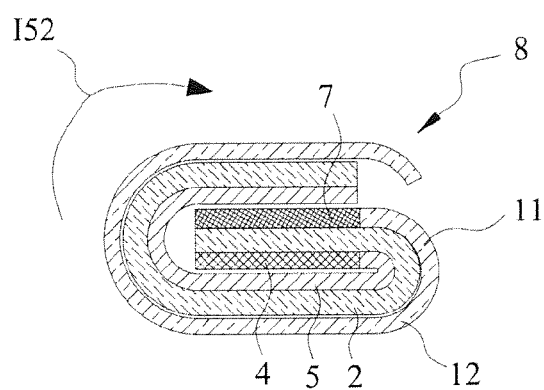

FIGS. 7A-7B illustrate successive steps of a process according to a fourth embodiment of the present invention. The structure of the instant embodiment is substantially identical to the structure shown in FIG. 3A and the difference is that the second surface 42 of the terminal distribution section 4 is provided with a reinforcement plate 7. As to the flap, the extended sheet 1 comprises an attaching section 11 and a wing 12, wherein the attaching section 11 is attached to the connection section 5 and is set to be adjacent to the second surface 42 of the terminal distribution section 4. The wing 12 is formed by extending from the attaching section 11 by a predetermined length.

In the successive steps of the instant embodiment, the connection section 5 is first folded in a folding direction I51 toward the first surface 41 of the terminal distribution section 4 (as shown in FIG. 7A). Next, the connection section 5, together with the wing 12 of the extended sheet 1, is wound up in a winding direction I52 (as shown in FIG. 7B) to form a rolled body 8, which is subsequently inserted through the bore of the hinge assembly 3, then allowing the wing 12 of the extended sheet 1 to re-expand.

Figure 8A:
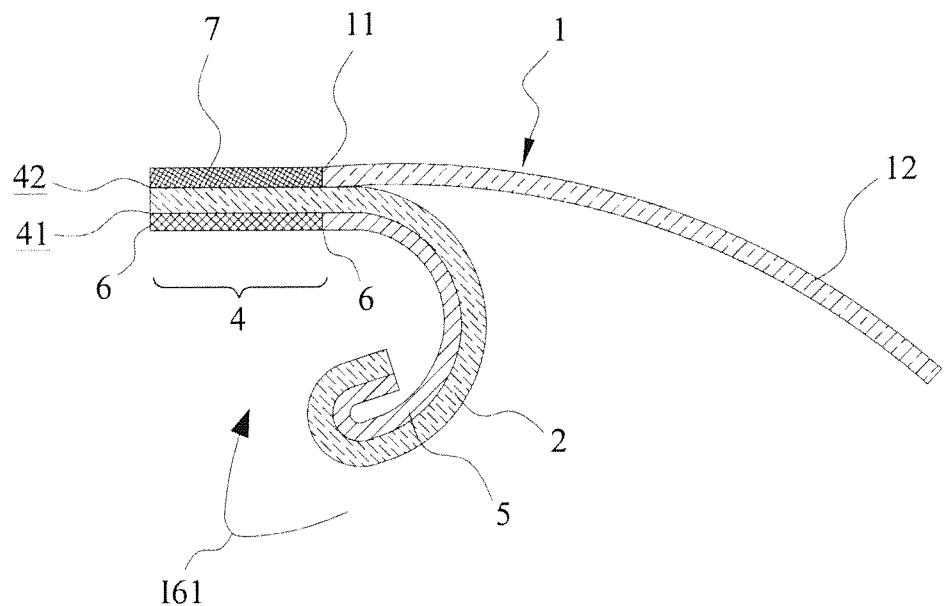
FIGS. 8A-8C illustrate successive steps of a fifth embodiment of the present invention.
Figure 8B:
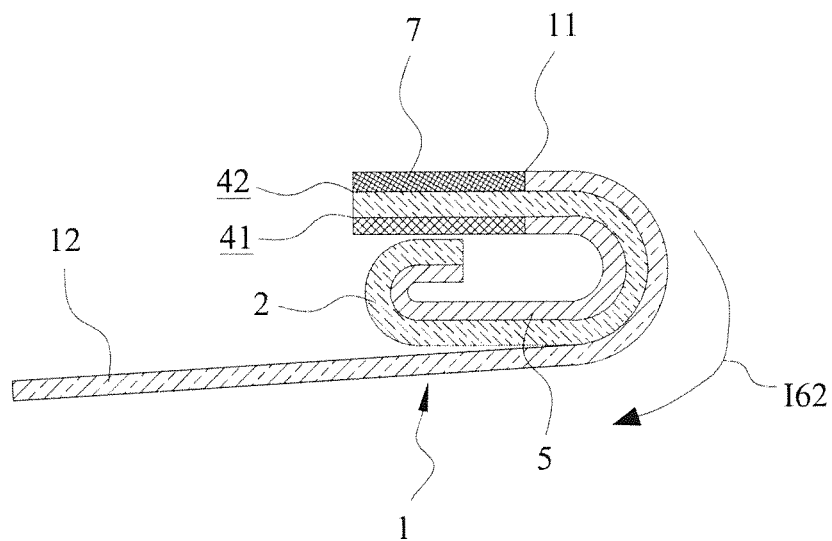
Figure 8C:
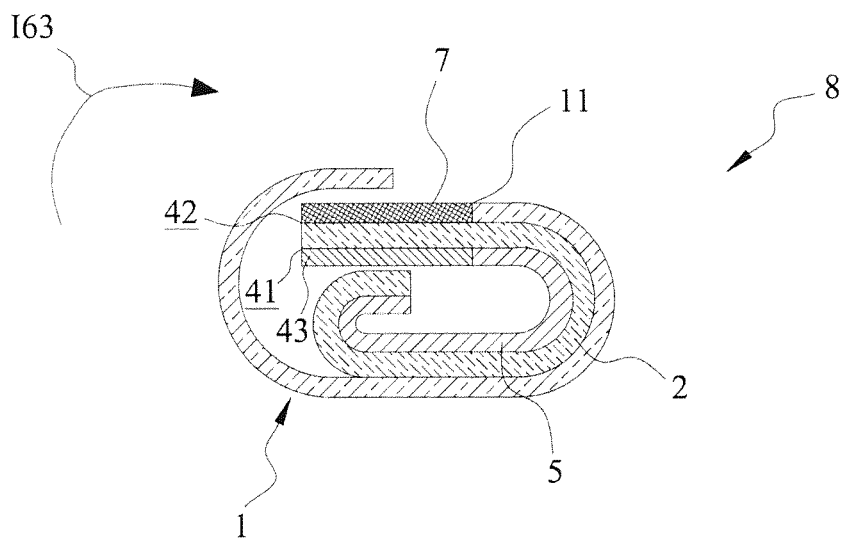

FIGS. 8A-8C illustrate successive steps of a process according to a fifth embodiment of the present invention. In the process, the connection section 5 is first folded in a folding direction I61 toward the first surface 41 of the terminal distribution section 4 (as shown in FIG. 8A). Next, the connection section 5, together with the wing 12 of the extended sheet 1, is wound up in a winding direction I62 (as shown in FIG. 8B). Afterwards, the wing 12 is wound, in a winding direction I63, toward the terminal distribution section 4 to form a rolled body 8 (as shown in FIG. 8C) to be subsequently inserted through the bore of the hinge assembly 3 to allow the wing 12 of the extended sheet 1 to be re-expanded.

Figure 9A:
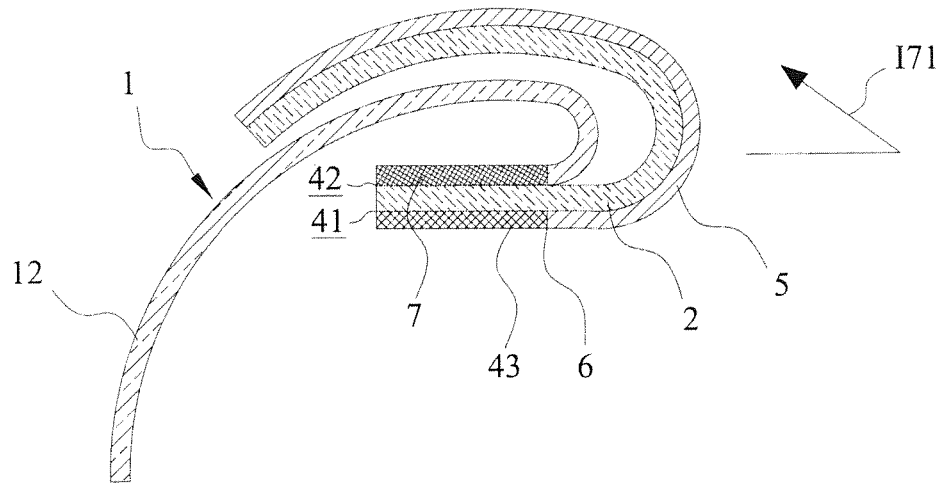
FIGS. 9A-9C illustrate successive steps of a sixth embodiment of the present invention.
Figure 9B:
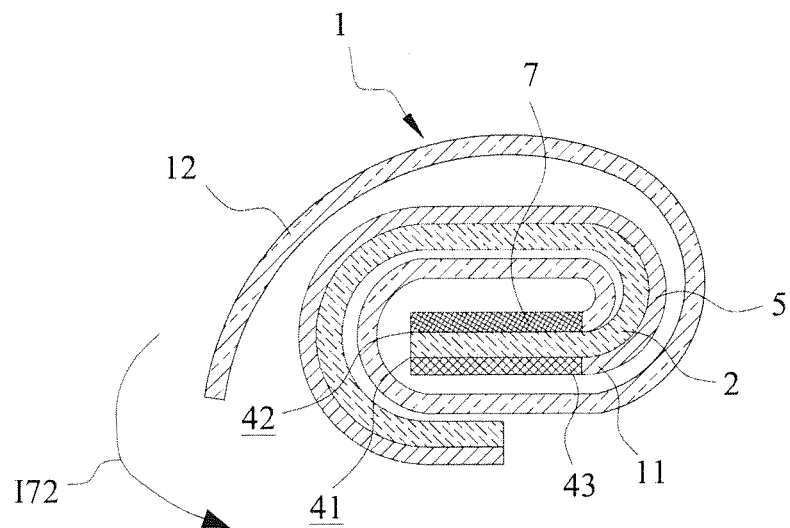
Figure 9C:
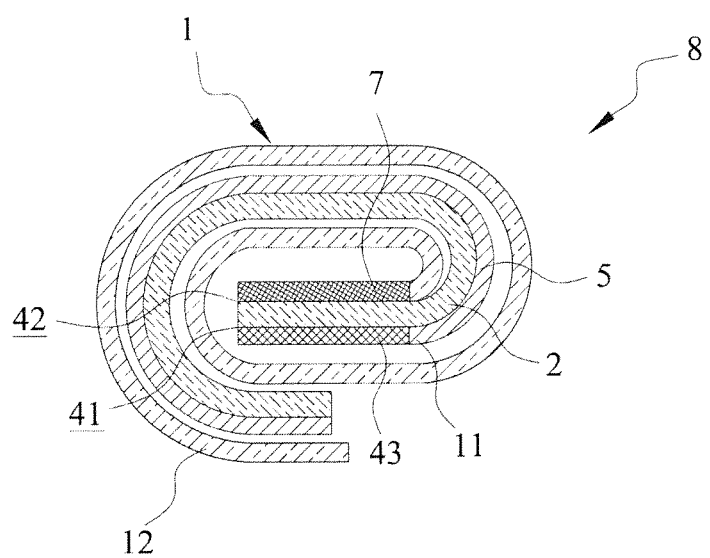

FIGS. 9A-9C illustrate successive steps of a process according to a sixth embodiment of the present invention. In the process, the connection section 5 is first folded in a folding direction I71 toward the second surface 42 of the terminal distribution section 4 (as shown in FIG. 9A). Next, the connection section 5, together with the wing 12 of the extended sheet 1, is wound up in a winding direction I72 toward the terminal distribution section 4 (as shown in FIG. 9B) to form a rolled body 8 (as shown in FIG. 9C).

Figure 10A:
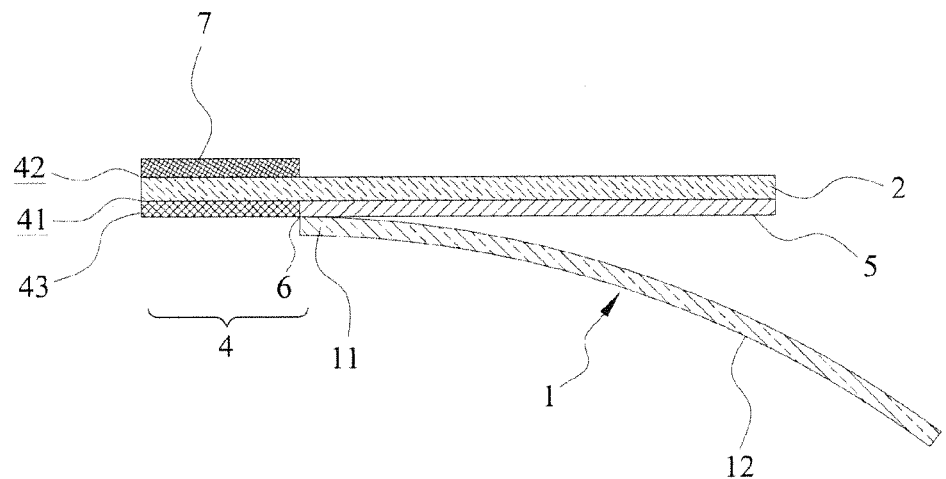
FIGS. 10A-10C illustrate successive steps of a seventh embodiment of the present invention
Figure 10B:
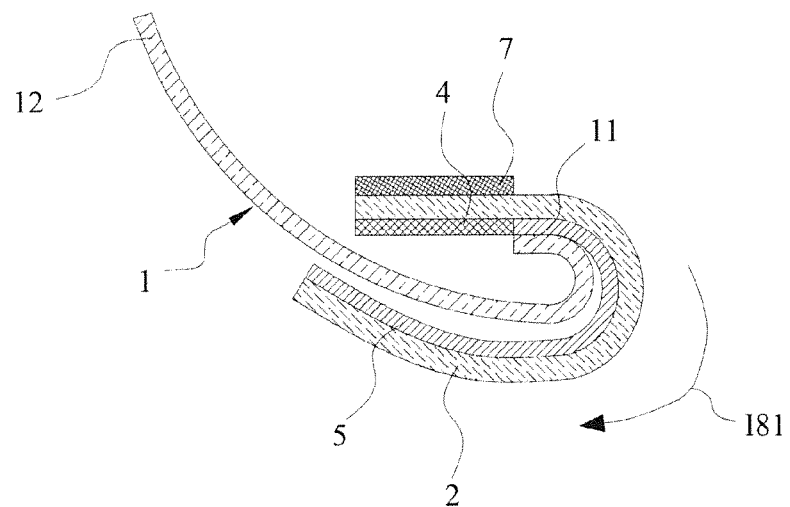
Figure 10C:
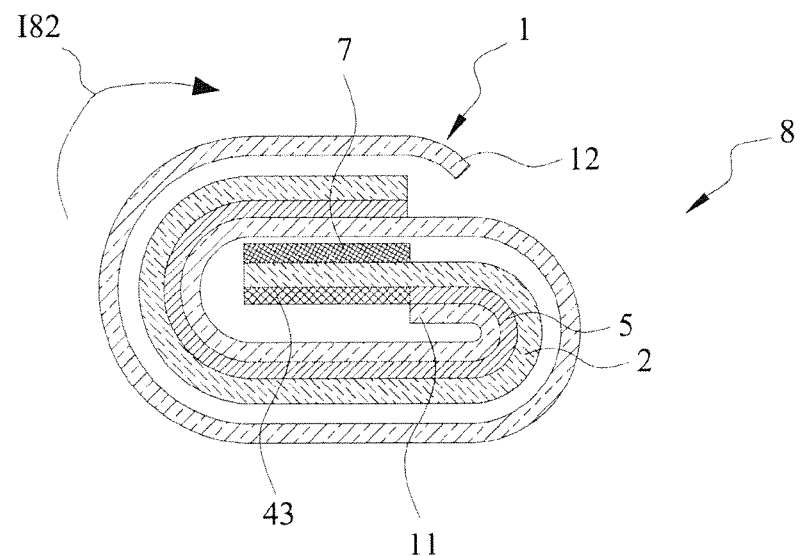

FIGS. 10A-10C illustrate successive steps of a process according to a seventh embodiment of the present invention.

The structure of the instant embodiment is substantially identical to the structure shown in FIG. 7A and the difference is that the attaching section 11 of the extended sheet 1 is instead attached to the connection section 5 and is set to be adjacent to the first surface 41 of the terminal distribution section 4. The wing 12 is formed by extending from the attaching section 11 by a predetermined length. In the process, the connection section 5 and the wing 12 of the extended sheet 1 are first wound up in a winding direction I81 (as shown in FIG. 10B). Afterwards, the wing 12 is wound, in a winding direction I82, toward the terminal distribution section 4 to form a rolled body 8 (as shown in FIG. 10C) for subsequently inserting through the bore of the hinge assembly 3 and then re-expanding the wing 12 of the extended sheet 1.

Figure 11A:
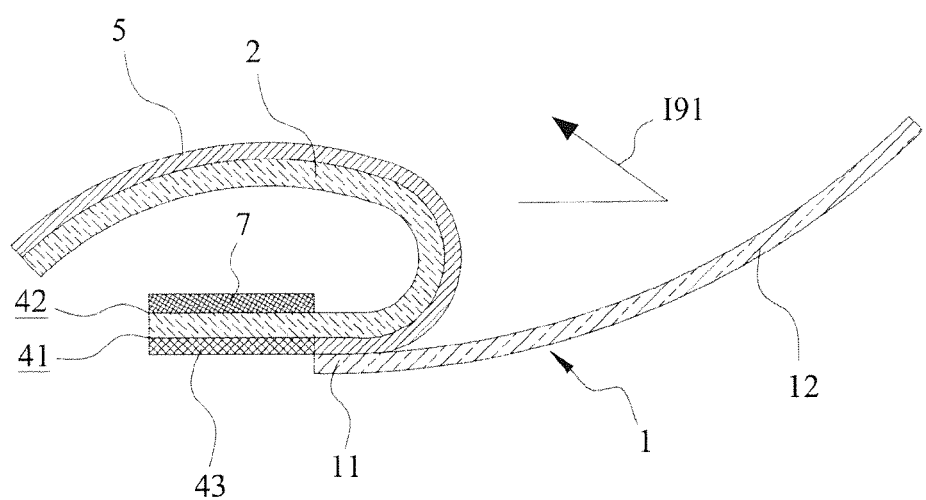
FIGS. 11A-11C illustrate successive steps of an eighth embodiment of the present invention.
Figure 11B:
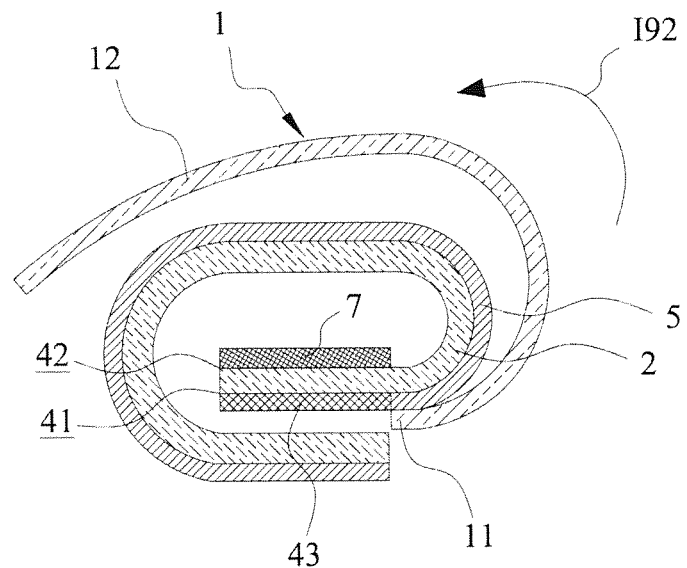
Figure 11C:
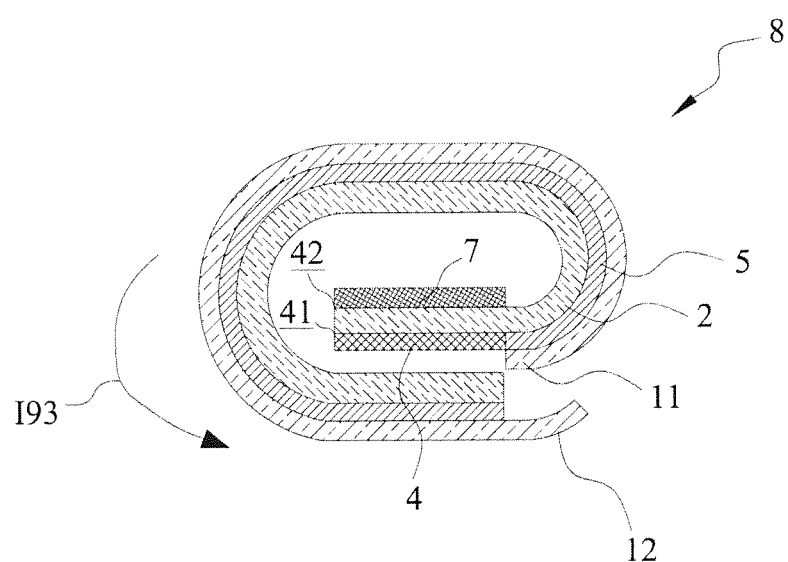

FIGS. 11A-11C illustrate successive steps of a process according to an eighth embodiment of the present invention. In the successive steps of the instant embodiment, the connection section 5 is first folded in a folding direction I91 toward the second surface 42 of the terminal distribution section 4 (as shown in FIG. 11A). Next, the connection section 5, together with the wing 12 of the extended sheet 1, is wound up in a winding direction I92 (as shown in FIG. 11B). Afterwards, the wing 12 is wound, in a winding direction I93, towards the terminal distribution section 4 to form a rolled body 8 (as shown in FIG. 11C) for subsequently inserting through the bore of the hinge assembly 3 and then re-expanding the wing 12 of the extended sheet 1.

Figure 12A:
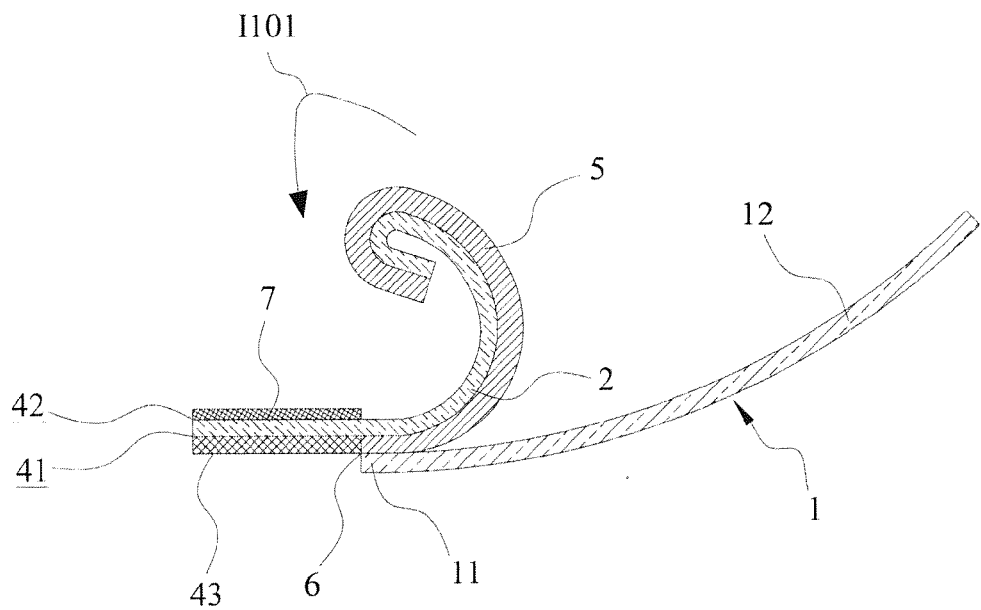
FIGS. 12A-12C illustrate successive steps of a ninth embodiment of the present invention.
Figure 12B:
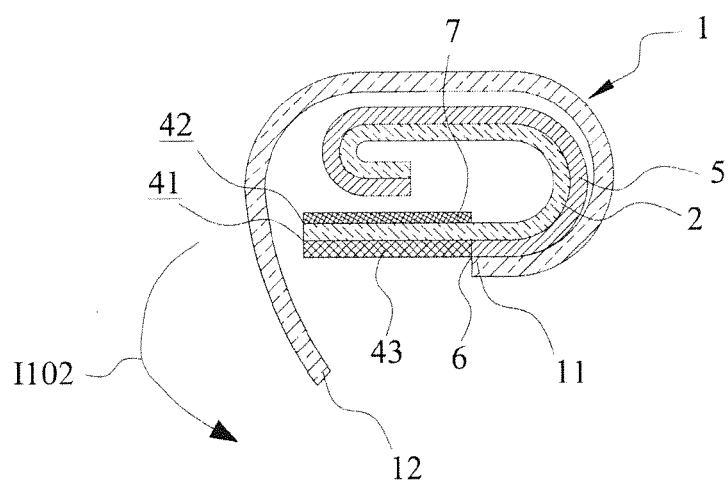
Figure 12C:
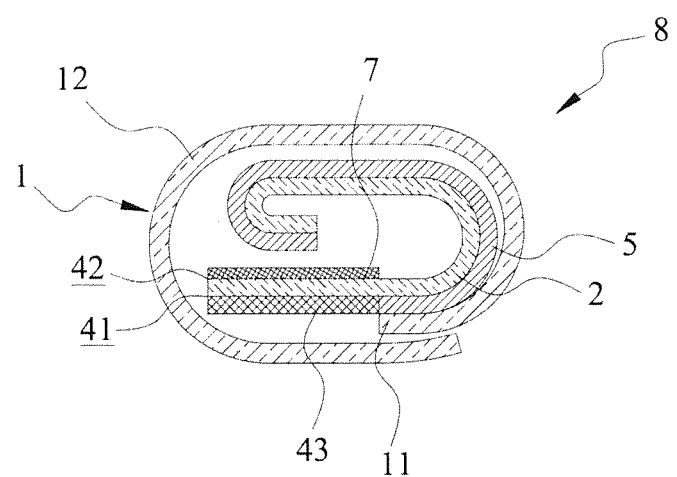

FIGS. 12A-12C illustrate successive steps of a process according to a ninth embodiment of the present invention. In the process, the connection section 5 is first folded in a folding direction I101 toward the second surface 42 of the terminal distribution section 4 (as shown in FIG. 12A). Next, the connection section 5, together with the wing 12 of the extended sheet 1, is wound up in a winding direction I102 (as shown in FIG. 12B) to form a rolled body 8 (as shown in FIG. 12C) for subsequently inserting through the bore of the hinge assembly 3 and then re-expanding the wing 12 of the extended sheet 1.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board having a structure for penetration and assembly through a bore of a hinge assembly, the flexible circuit board comprising:
    a first end;
    a second end; and
    an extension section extending in an extension direction and arranged between the first end and the second end;
    the first end of the flexible circuit board including:
        a terminal distribution section having a plurality of isolated conductive terminals;
        a connection section extending from an edge of the terminal distribution section to define a planar surface therewith, wherein the connection section is connected between the terminal distribution section and the extension section; and
        an extended sheet attached at an attaching section on the planar surface, the extended sheet including a wing extending from the attaching section to form a flexible flap structure covering a portion of the planar surface and terminating beyond a peripheral edge of the connection section;
        wherein a rolled body is formed by folding the connection section along a pre-folding line towards the terminal distribution section, and wrapping the wing about the connection section and the terminal distribution section;
    the rolled body being thereby configured to pass through the bore of the hinge assembly for guiding the extension section of the flexible circuit board through the bore of the hinge assembly and dispose the first and second ends emerging from opposite ends of the bore of the hinge assembly; the wing of the extended sheet being unwrapped to release the connection and terminal distribution sections to a flat and expanded condition.

2. The structure as claimed in claim 1, wherein the extension section comprises a cluster structure, the cluster structure comprising a plurality of cluster lines that is formed by cutting the flexible circuit board along a plurality of slit lines in the extension direction.

3. The structure as claimed in claim 1, wherein the connection section is wound around the second surface of the terminal distribution section to form the rolled body.

4. The structure as claimed in claim 1, wherein the connection section is wound and received in the first surface of the terminal distribution section to form the rolled body.

5. The structure as claimed in claim 1, wherein at least one carve is formed between the terminal distribution section and the connection section of the flexible circuit board to serve as the pre-folding line.

\* \* \* \* \*